United States Patent
Wu

(10) Patent No.: US 6,207,526 B1
(45) Date of Patent: Mar. 27, 2001

(54) METHOD OF FABRICATING AN EXTENDED SELF-ALIGNED CROWN-SHAPED RUGGED CAPACITOR FOR HIGH DENSITY DRAM CELLS

(75) Inventor: Shye-Lin Wu, Hsinchu (TW)

(73) Assignee: Acer Semiconductor Manufacturing Corp., Hsin-Chu (TW)

( * ) Notice: Subject to any disclaimer, the term of this patent is extended or adjusted under 35 U.S.C. 154(b) by 0 days.

(21) Appl. No.: 09/353,508

(22) Filed: Jul. 14, 1999

Related U.S. Application Data

(63) Continuation-in-part of application No. 09/123,748, filed on Jul. 27, 1998, now Pat. No. 6,063,683.

(51) Int. Cl.[7] ............................................ H01L 21/8242
(52) U.S. Cl. ...................... 438/397; 438/398; 438/254; 438/255
(58) Field of Search .................................. 438/398, 255, 438/396, FOR 212, FOR 220, 254, 397, 253; 257/308, 309

(56) References Cited

U.S. PATENT DOCUMENTS 5,554,557 * 9/1996 Koh .
6,080,633 * 6/2000 Sze et al. .

* cited by examiner

*Primary Examiner*—George Fourson
*Assistant Examiner*—Barbara E. Abbott

(57) ABSTRACT

The method of the present invention for forming a capacitor on a semiconductor substrate includes the following steps. At first, a first oxide layer is formed over the substrate and a nitride layer is then formed over the oxide layer. A second oxide layer is then formed over the nitride layer and a first silicon layer is formed over the second oxide layer. Next, a node opening is defined in the first silicon layer, the second oxide layer, and the nitride layer, upon the first oxide layer. Sidewall structures are then formed on sidewalls of the node opening. A contact opening is then defined in the first oxide layer under the node opening. The contact opening is defined in the first oxide layer under a region uncovered by the sidewall structures. The sidewall structures and a portion of the nitride layer nearby the node opening are removed to form undercut structures under the second oxide layer. A second silicon layer is then formed conformably over the contact opening, the undercut structures, the node opening, and the first silicon layer. A node-top defining layer is formed on the second silicon layer and is patterned to leave a node-top defining region. Next, a portion of the second silicon layer and a portion of the first silicon layer uncovered by the node-top defining region are removed. Silicon sidewalls are formed on sidewalls of the node-top defining region, and are communicated to the first silicon layer and the second silicon layer to form an electrode. The node-top defining region, the second oxide layer, and the nitride layer are removed. A wet etch is performed to remove the nitride layer and to roughen the surface of the electrode. A dielectric film is then formed conformably over the electrode. Finally, a conductive layer is formed over the dielectric layer.

20 Claims, 6 Drawing Sheets

METHOD OF FABRICATING AN EXTENDED SELF-ALIGNED CROWN-SHAPED RUGGED CAPACITOR FOR HIGH DENSITY DRAM CELLS

CROSS REFERENCE TO RELATED APPLICATIONS

This invention is a continuation-in-part application of an application filed under the title of "METHOD OF FABRICATING A SELF-ALIGNED CROWN-SHAPED CAPACITOR FOR HIGH DENSITY DRAM CELLS" with the Ser. No. 09/123,748 filed at Jul. 27, 1998, which is now U.S. Pat. No. 6,063,683 which is assigned to the same assignee with the same inventor as the present application.

FIELD OF THE INVENTION

The present invention relates to semiconductor manufacturing processes, and more specifically, to a method of fabricating a self-aligned crown-shaped rugged capacitor for high density DRAM (dynamic random access memory) cells.

BACKGROUND OF THE INVENTION

In the electric industry, memory devices are of vital application in various kinds of computer, communication, and consumer electronic products. In the electric equipment, memory devices are employed for the storage and exchange of operating data and information. The information can be stored temporarily or permanently in various kinds of memory devices, depending on the system design and needs. The DRAM is one of the most important memory devices for providing temporary data storage in numerous system applications. In the last decade, the DRAM has become the flagship product of the semiconductor industry for its high-density structure and wide applications.

In general, a DRAM cell is composed of a transistor and a capacitor. A MOSFET (metal oxide semiconductor field effect transistor) is utilized preferably to enable the writing and the reading of the data. The capacitor is employed to store electric charge, wherein the data is represented by the voltage level of the electric charge. The DRAM cells can be accessed with unlimited reading and writing cycles with high frequency and reliability.

For reducing the cost and increasing the competitive power of the DRAM devices, the density of DRAM cells on a unit of chip area must be raised continuously. The number of DRAM cells on each chip has increased from 16M to 64M and it is believed that the 256M and higher volume DRAM chips will become the most competitive products before the end of the twentieth century. With the fast increasing density, the area occupied by each DRAM cell with a transistor and a capacitor has to narrow down several times while providing the same function and operation on data storage and exchange.

However, since the storage capacity of a capacitor is proportional to the surface area of the electrode, the capacitor structure of the traditional plate electrode must be improved. The capacitor structure must be redesigned to provide raised storage capacity or the capacitance under per unit chip area. In prior art designs, various types of stacked-capacitor structure have been proposed. As an example, M. Sakao et al. proposed a capacitor-over-bit-line (COB) cell structure in their work "A Capacitor-Over-Bit-Line (COB) Cell with a Hemispherical-Grain Storage Node for 64 Mb DRAMs" (in IEDM Tech. Dig., p. 655, 1990). It is disclosed in this reference that three-dimensional memory cells, such as stacked or trench capacitor cells, are necessary for future DRAMs in order to obtain sufficient storage capacitance in a small area. Several stacked capacitor cells have been proposed for 64 Mb DRAMs, because, as compared to trench capacitor cells, their fabrication procedure is relatively simple and they offer higher immunity to soft error. In the stacked capacitor cell, large capacitance can be obtained by increasing storage node height, but this causes difficulties with optical delineation and patterning. Three dimensionally arranged storage node structures have been proposed. However, the attempts cause difficulties in the fabrication procedure.

H. Wantanabe et al. disclosed a new cylindrical capacitor structure in their work "A New Cylindrical Capacitor Using Hemispherical Grained Si (HSG-Si) for 256 Mb DRAMs" (in IEDM Tech. Dig., p.259, 1992). A new selective etching technique using a low-pressure vapor hydrogen fluoride is developed to form the cylindrical capacitor electrode. A high selective etching (2000 times) of borophospho-silicate-glass to $SiO_2$ is realized with the technique. Disilane molecule irradiation in ultra-high vacuum chamber achieves the HSG-Si formation on the whole surface of phosphorous doped amorphous Si cylindrical electrode.

However, conventional stacked-capacitor structures have some unsolved strength problem in the fabrication of three-dimensional electrodes. In general, most of the three dimensional electrode structure are composed of several silicon layer which are deposited and defined separately. The three-dimensional structures with interfaces of several deposition processes on a single node are found to suffer from defect issues like cracks. The problem greatly damages the yield of the process. In addition, for developing future high density DRAMs, the conventional stacked-capacitor structure cannot get sufficient capacitance. What is needed in the field is an improved design of a capacitor cell structure with raised storage capacitance without strength problems such as the crack issue during manufacturing processes.

SUMMARY OF THE INVENTION

The present invention discloses a method of fabricating a storage cell as a capacitor. An extended self-aligned crown-shaped rugged capacitor for high density DRAM cells can be formed without the prior art crack issue. One of the advantages of the method provided in the invention is that the storage cell can be formed with reduced processing steps by the self-aligned approach in the present invention. The self-aligned process in forming capacitor contact opening can be integrated into the semiconductor process of forming high-density DRAM cells. The capacitor structure having extended upper crown regions formed by the proposed method can provide improved capacitance than conventional stacked-capacitor structure. The number of masks used can also be reduced with the self-aligned process in providing the base structure of the capacitor node with improved strength and reliability.

The method of the present invention for forming a capacitor on a semiconductor substrate includes the following steps. At first, a first oxide layer is formed over the substrate and a nitride layer is then formed over the oxide layer. A second oxide layer is formed over the nitride layer and a first silicon layer is formed over the second oxide layer. Next, a node opening is defined in the first silicon layer, the second oxide layer, and the nitride layer, upon the first oxide layer. Sidewall structures are then formed on sidewalls of the node opening.

A contact opening is then defined in the first oxide layer under the node opening. The contact opening is defined in the first oxide layer under a region uncovered by the sidewall structures. The sidewall structures and a portion of the nitride layer nearby the node opening are removed to form undercut structures under the second oxide layer. A second silicon layer is then formed conformably over the contact opening, the undercut structures, the node opening, and the first silicon layer. A node-top defining layer is formed on the second silicon layer and is patterned to leave a node-top defining region. Next, a portion of the second silicon layer and a portion of the first silicon layer uncovered by the node-top defining region are removed. Silicon sidewalls are formed on sidewalls of the node-top defining region, and are communicated to the first silicon layer and the second silicon layer to form an electrode. The node-top defining region, the second oxide layer, and the nitride layer are removed. A wet etch is performed to remove the nitride layer and to roughen the surface of the electrode. A dielectric film is then formed conformably over the electrode. Finally, a conductive layer is formed over the dielectric layer.

In the illustrative examples of the present invention, a wet etch process is employed and preferably applied to roughen the surface of the electrode. In the preferred embodiments, the wet etch is carried out with a hot phosphoric solution to remove the remaining silicon nitride layer, and also to remove part of the surface portion of the electrode of silicon material, in order to roughen the surface of the electrode for having a rugged surface. Therefore, a greatly raised capacitance is provided by the rugged structure of the bottom electrode.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of fabricating an extended crown-shaped rugged capacitor is disclosed in the present invention. The self-aligned process in forming capacitor contact opening can be integrated into the semiconductor process of forming high-density DRAM cells. The capacitor structure having extended upper crown regions formed by the proposed method can provide improved capacitance compared with conventional stacked-capacitor structure. The number of masks used can also be reduced with the self-aligned process in providing the base structure of the capacitor node with improved strength and reliability.

Figure 1:
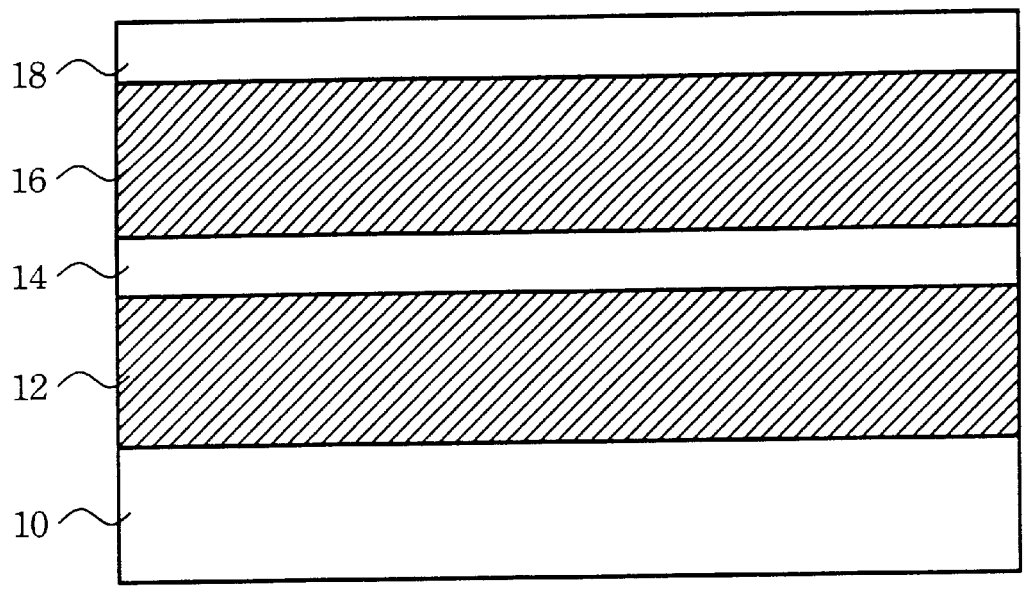
FIG. 1 illustrates a cross-sectional view of forming a first oxide layer, a nitride layer, a second oxide layer, and a first silicon layer over a substrate in accordance with the present invention.

Referring to FIG. 1, a semiconductor substrate 10 is provided for forming capacitors over. In general, a substrate 10 with a preferably single crystalline silicon in a <100> direction is provided. For different applications or specifications, a substrate with different crystalline orientations or materials can be used alternatively. As an example, the substrate 10 is provided with transistors formed over in a DRAM fabricating processes. For a clear and focused illustration of the present invention, the transistors are not shown. In the following figures, only a focused region of forming a single storage cell is presented and it is well known in the art to form numerous storage cells on a single wafer or substrate by a batch of semiconductor processes.

At first, a first oxide layer 12 is formed over the substrate 10. The first oxide layer 12 is formed preferably with a chemical vapor deposition (CVD) process. A nitride layer 14 is then formed over the oxide layer, also preferably by a chemical vapor deposition process. Followed with the nitride layer 14, a second oxide layer 16 is formed over and a chemical vapor deposition process can be employed in the case. Next, a first silicon layer 18 is formed over the second oxide layer 16. In the preferred embodiment, the first silicon layer can be a polysilicon layer. The polysilicon layer can be formed with well-known deposition processes.

Figure 2:
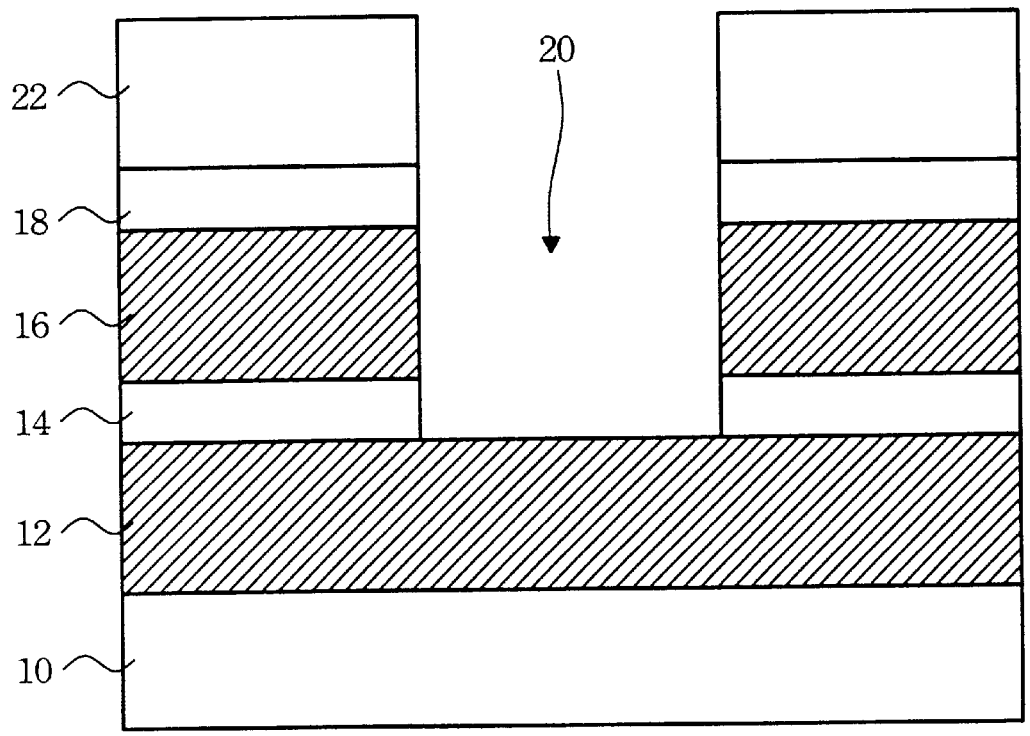
FIG. 2 illustrates a cross-sectional view of defining a node opening in the first silicon layer, the second oxide layer, and the nitride layer upon the first oxide layer in accordance with the present invention.

Turning to FIG. 2, a node opening 20 is defined in the first silicon layer 18, the second oxide layer 16, and the nitride layer 14. The node opening 20 is defined right upon the first oxide layer 12 in the case. The node opening 20 can be formed with sequentially a lithography process and etching processes. A photoresist layer 22 can be utilized in the lithography process to define a region of forming the node opening 20, as indicated in the figure. As a preferred embodiment, a region of forming the node opening 20 can be defined in a circular shape and thus the node opening 20 is defined as a cylindrical-shaped opening. The unmasked regions of the first silicon layer 18, the second oxide layer 16, and the nitride layer 14 are then removed with preferably an anisotropic etching process. The process like reactive ion etching (RIE) process can be applied.

Figure 3:
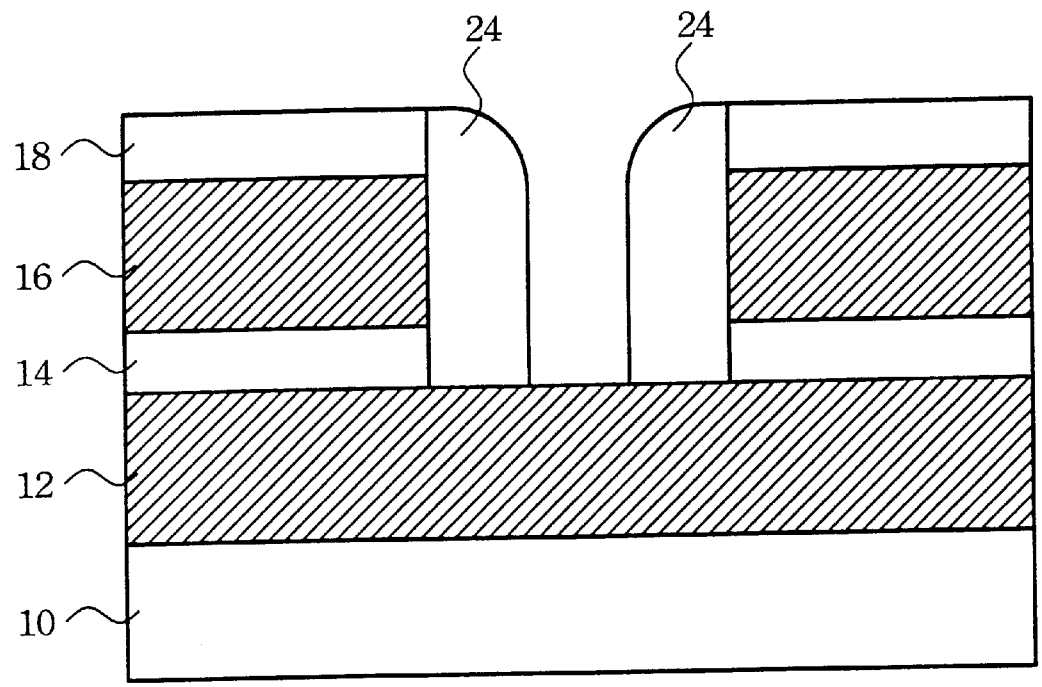
FIG. 3 illustrates a cross-sectional view of forming sidewall structures on sidewalls of the node opening in accordance with the present invention.
Figure 4:
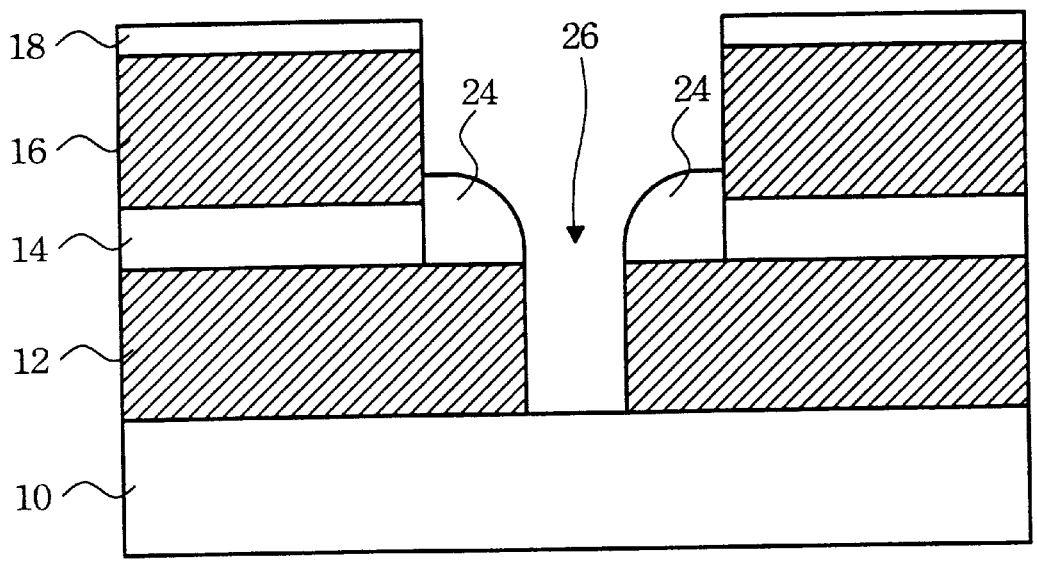
FIG. 4 illustrates a cross-sectional view of defining a contact opening in the first oxide layer under the node opening in accordance with the present invention.

Next, sidewall structures 24 are then formed on sidewalls of the node opening 20, as shown in FIG. 3. In the case, nitride sidewall structures are formed as the sidewall structures 24. A nitride depositing and etching-back process can be performed to form nitride spacers. Turning to FIG. 4, a contact opening 26 is defined in the first oxide 12 under the node opening 20. The contact opening 26 is defined under a region uncovered by the sidewall structures 24. With the masking of the sidewall structures 24, a self-aligned patterning process preferably with a dry etching step can be exploited in defining the contact opening 26.

Figure 5:
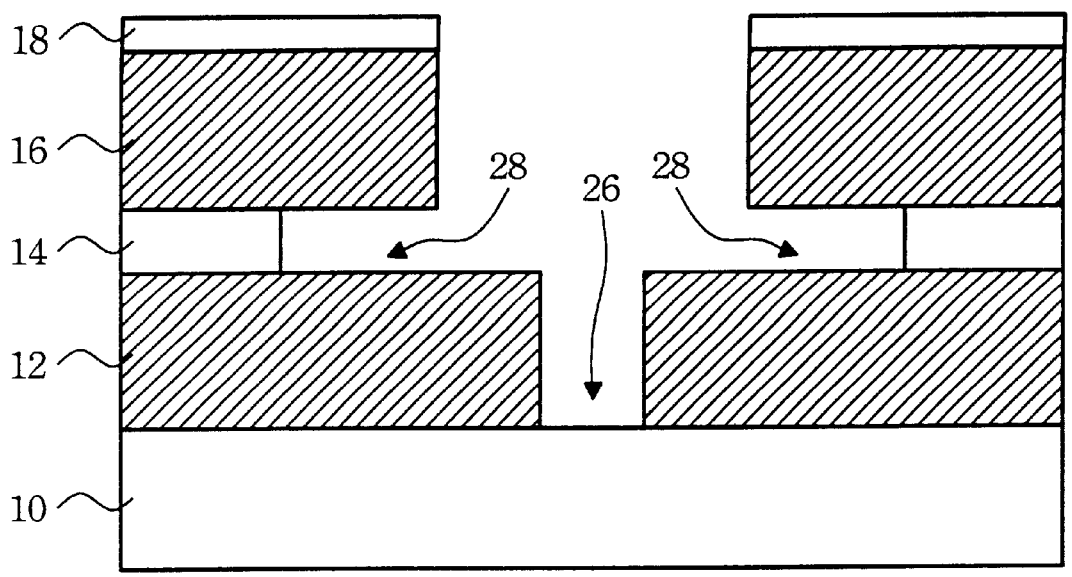
FIG. 5 illustrates a cross-sectional view of removing the sidewall structures and a portion of the nitride layer nearby the node opening in accordance with the present invention.
Figure 6:
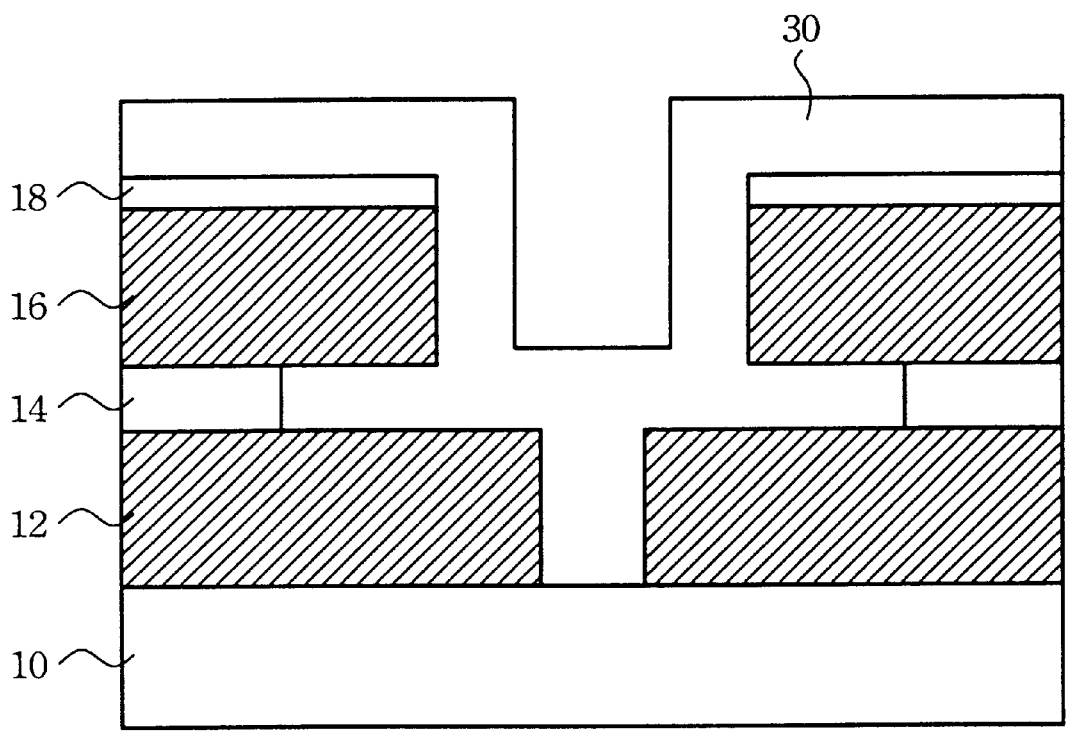
FIG. 6 illustrates a cross-sectional view of forming a second silicon layer conformably over the contact opening, the undercut structures, the node opening, and the first silicon layer in accordance with the present invention.

Referring to FIG. 5, after the contact opening 26 is defined, the sidewall structures 24 and a portion of the nitride layer 14 are removed. The portion of the nitride layer 14 which located nearby the node opening are removed to form undercut structures 28 under the second oxide layer 16, as indicated in the figure. An isotropic wet etching step can be applied. With the nitride material of the sidewall structures 24 and the nitride layer 14, an etchant of hot phosphoric acid ($H_3PO_4$) can be used. Turning to FIG. 6, a second silicon layer 30 is formed conformably which the contact opening 20, the undercut structures 28, the node opening 26, on and the first silicon layer 18. Being employed as an electrode of the storage cell, the second silicon layer 30 can be a doped polysilicon layer. The doped polysilicon layer can be formed with a deposition process. A in-situ doping process can be utilized to dope n-type or p-type dopants. In the case, n-type dopants are doped for providing a low resistance.

Figure 7:
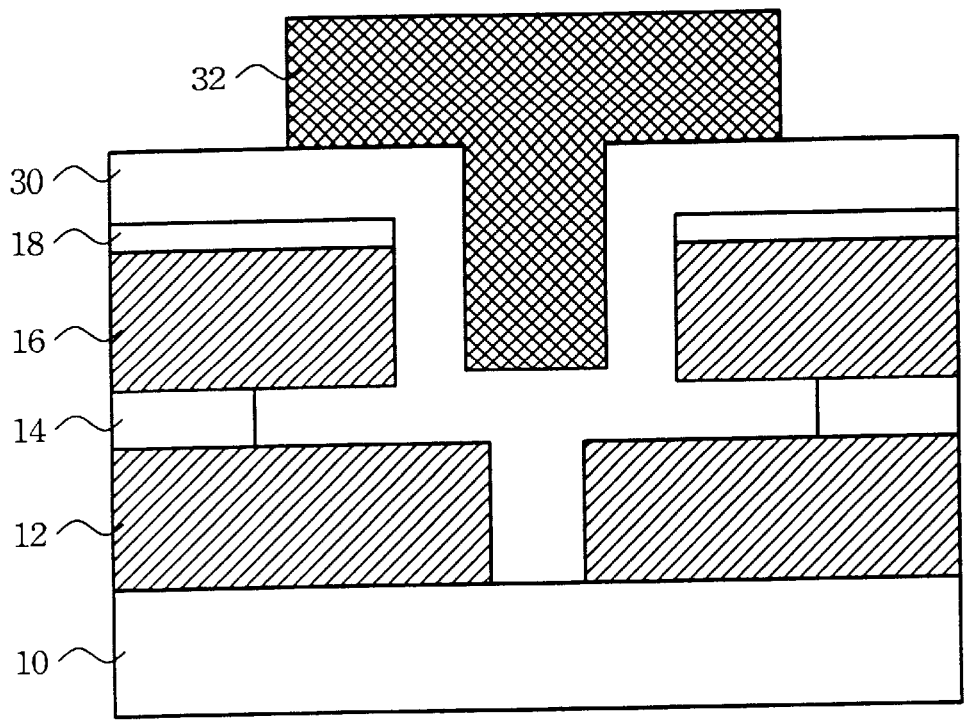
FIG. 7 illustrates a cross-sectional view of forming and patterning a node-top defining layer over the second silicon layer in accordance with the present invention.

Next, a node-top defining layer is formed over the second silicon layer 30, as shown in FIG. 7. In the preferred embodiments, the node-top defining layer is a silicon oxide layer for creating the shape of the capacitor at the top portion. Alternatively, other dielectric materials or photoresist can be used as node-top defining layer. The node-top defining layer is then patterned to define a node-top defining region 32 by appropriate patterning processes, like the applying of a lithography process and an etch step.

Figure 8:
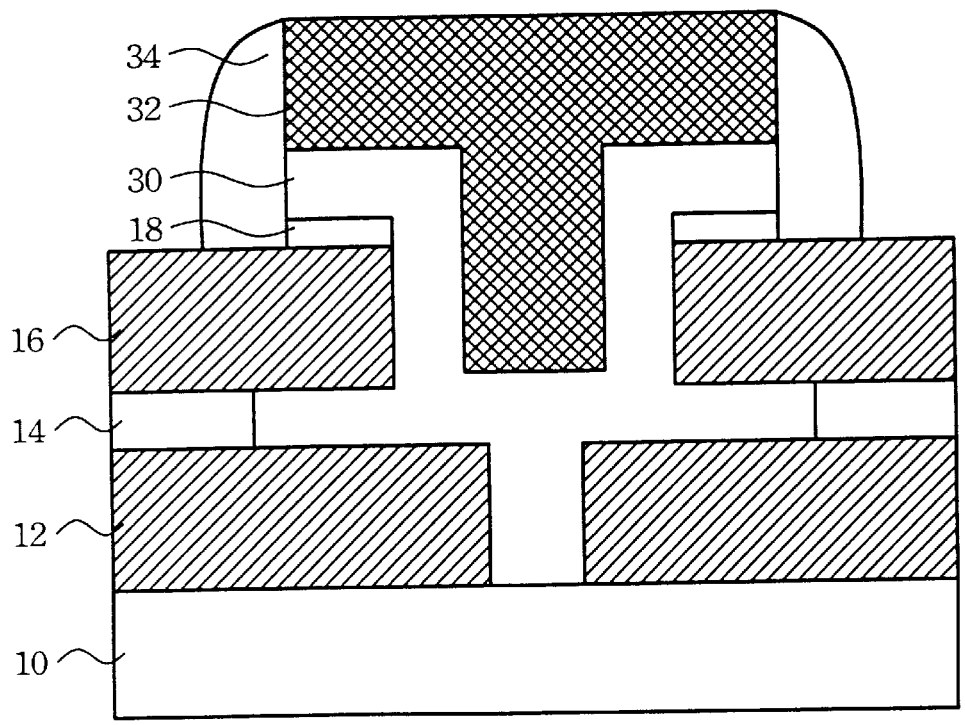
FIG. 8 illustrates a cross-sectional view of forming silicon sidewalls on the sidewalls of the node-top defining region in accordance with the present invention.

Turning to FIG. 8, after the node-top defining region 32 is formed, a portion of the second silicon layer 30 and a portion of the first silicon layer 18 uncovered by the node-top defining region 32 are removed. In the case, a isotropic etch process like a reactive ion etch (RIE) can be applied.

Having the shape of the node-top defining region 32, silicon sidewalls 34 are then formed on sidewalls of the node-top defining region 32. Generally, the silicon sidewalls 34 are formed by forming a silicon layer with chemical vapor deposition (CVD) process. A dry etch-back process is then applied to leave the silicon sidewalls spacers on 34 sidewalls of the node-top defining region 32. In the preferred embodiments, the silicon sidewalls 34 are polysilicon spacers. Therefore, the silicon sidewalls 34 can communicate to the first silicon layer 18 and the second silicon layer 32, and the three conductive regions are combined as a bottom electrode 36 of the capacitor, as indicated in FIG. 9.

Figure 9:
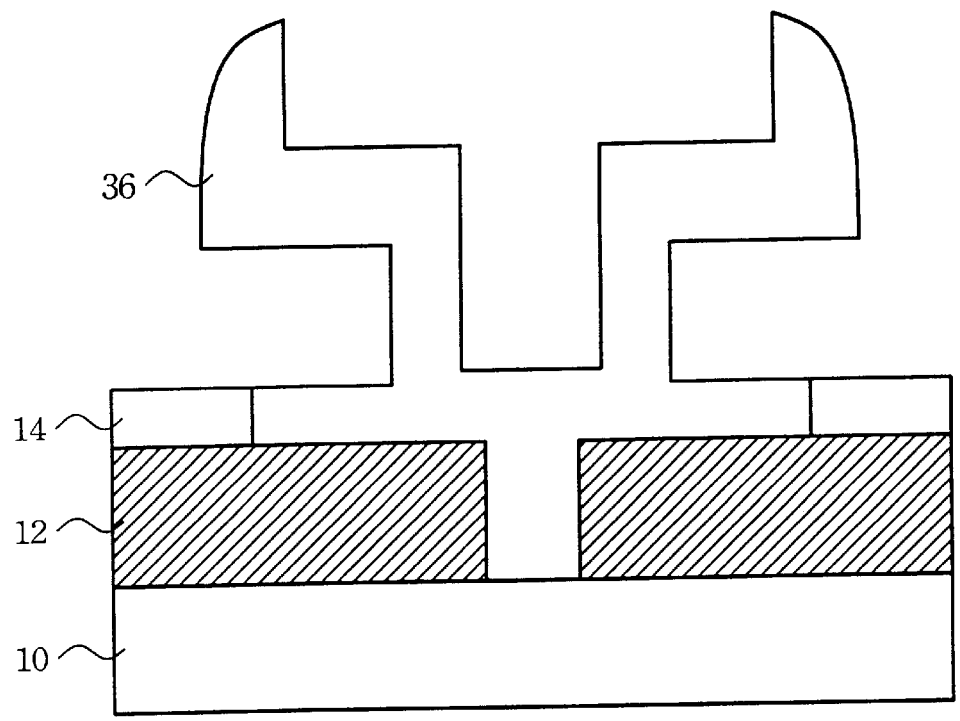
FIG. 9 illustrates a cross-sectional view of removing the node-top defining region inside the silicon sidewalls and the second oxide layer in accordance with the present invention.

As shown in FIG. 9, the node-top defining region 32 and the second oxide layer 16 are then removed. In the example of employing silicon oxide as the node-top defining region 32, both of them are removed with a hydrofluoric acid (HF) in a wet etching process. The wet etching is performed using the nitride layer 14 and the second silicon layer 30 as stop layers for masking the underlying structures.

Figure 10:
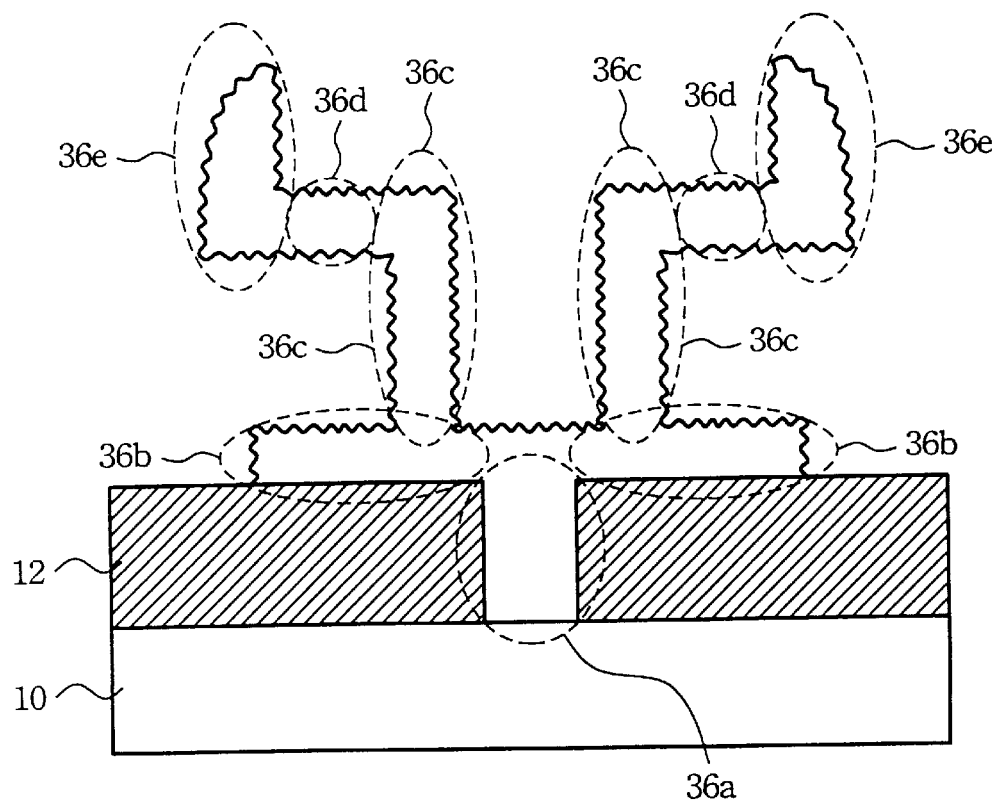
FIG. 10 illustrates a cross-sectional view of removing the nitride layer and also preferably roughening the surface of the electrode in accordance with the present invention.

Turning to FIG. 10, another step is performed to remove the nitride layer 14. A wet etch process is employed and preferably applied to roughen the surface of the electrode 36. In the preferred embodiments, the wet etch is carried out with a hot phosphoric solution to remove remained silicon nitride 14, and also to remove part of the surface portion of the electrode 36 of silicon, in order to roughen the surface of the electrode 36 for having a rugged surface as shown in the figure. In the most preferred embodiment, the composition of the phosphoric acid solution ($H_3PO_4$) is preferably about 86+/−1% $H_3PO_4$ and 14+/−1% $H_2O$. The temperature used in the embodiment is preferably about 150–170° C., and can be in the range of between about 140° C. to 180° C. in general.

Therefore, the bottom electrode 36 having a rugged surface of a storage cell is formed as shown in FIG. 10. The bottom electrode 36 in the present invention is mainly composed of the two silicon regions to provide a three-dimensional electrode structure. However, the main structure including the node contact 36a, the horizontal edges 36b, the vertical extensions 36c, and the lateral extensions 36d are mainly composed with the second silicon layer under a single-step deposition. Therefore, the main structure provides better strength with reduced number of interfaces between deposited silicon layers. In addition to the improved strength, the vertical portion 34b of the electrode can be well-supported with the lateral extended edge 34c and a better reliability in structure is provided therefrom, as indicated in the figure.

Figure 11:
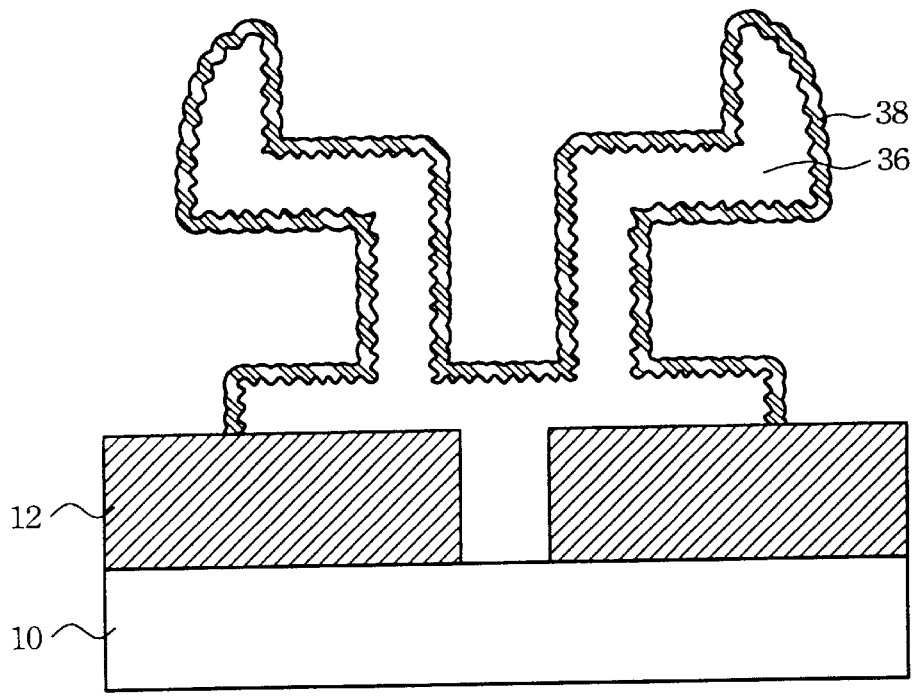
FIG. 11 illustrates a cross-sectional view of forming a dielectric film conformably over the electrode of silicon layers in accordance with the present invention.

Referring to FIG. 11, a dielectric film 38 is then formed conformably on the substrate 36, or namely on the rugged bottom electrode 36. In this embodiment, a thin dielectric layer 38, such as stacked oxide-nitride-oxide (ONO) film, is formed on the exposed surface of the bottom electrode 36 and the surface of the first oxide layer 12. As is known in the art of DRAM fabrication, the ONO film is reliable over silicon surfaces, and is typically used as a capacitor insulator. Other material, such as NO (silicon nitride-silicon oxide), $Ta_2O_5$, $TiO_2$, lead zirconate titanate PZT, or barium strontium titanate BST can be used as the thin dielectric layer 36.

Figure 12:
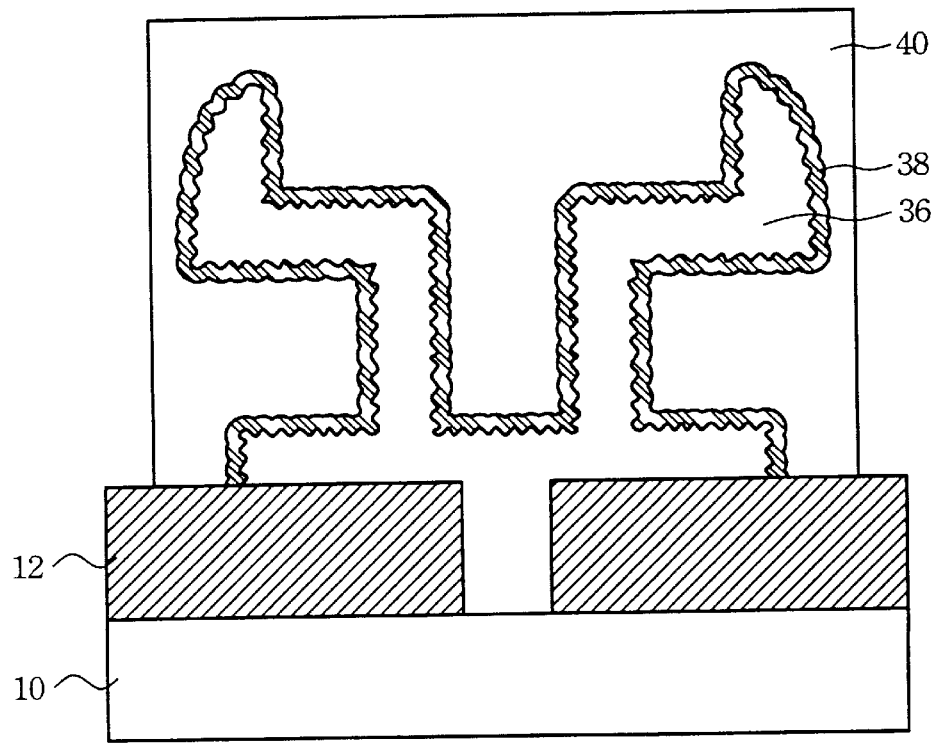
FIG. 12 illustrates a cross-sectional view of forming a conductive layer over the dielectric layer in accordance with the present invention.

Finally, a conductive layer 40 is then deposited over the stacked silicon oxide/silicon nitride/silicon oxide layer 38, as shown in FIG. 12, to serve as an upper plate of the DRAM cell capacitor, thereby forming a dynamic random access memory cell with a crown-shaped rugged capacitor. Typically, the conductive layer 40 is a doped polysilicon layer formed in the same manner as the second silicon layer 30. Other material, such as metal or metal silicide, can be used as the conductive layer 40.

Therefore, an extended self-aligned crown-shaped rugged capacitor is formed with the above-described method. The storage capacitance, under the greatly increase surface area of the proposed structure with the rugged surface, can be significantly increased compared with the prior art structures. The crack issue of sidewall polysilicon in the conventional processes can be eliminated with reduced number of interfaces in forming the main structure of the bottom electrode 36 with the self-aligned process.

As is understood by a person skilled in the art, the foregoing descriptions of the preferred embodiment of the present invention are an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a capacitor on a semiconductor substrate, said method comprising the steps of:

forming a first oxide layer over the substrate;

forming a nitride layer over said first oxide layer;

forming a second oxide layer over said nitride layer;

forming a first silicon layer over said second oxide layer;

defining a node opening in said first silicon layer, said second oxide layer, and said nitride layer upon said first oxide layer;

forming sidewall structures on the sidewalls of said node opening;

defining a contact opening in said first oxide layer under said node opening, said contact opening being defined under a region uncovered by said sidewall structures;

removing said sidewall structures and a portion of said nitride layer nearby said node opening to form undercut structures under said second oxide layer;

forming a second silicon layer which fills said contact opening, said undercut structures, said node opening, and on said first silicon layer;

forming and patterning a node-top defining layer on said second silicon layer to leave a node-top defining region;

removing a portion of said second silicon layer and a portion of said first silicon layer uncovered by said node-top defining region;

forming silicon sidewalls on the sidewalls of said node-top defining region, said silicon sidewalls communicating to said first silicon layer and said second silicon layer to form an electrode;

removing said node-top defining region and said second oxide layer;

removing said nitride layer;

forming a dielectric film conformably on said electrode; and forming a conductive layer over said dielectric layer.

2. The method of claim 1, wherein said first oxide layer and said second oxide layer are formed by chemical vapor deposition processes.

3. The method of claim 1, wherein said first silicon layer comprises a polysilicon layer.

4. The method of claim 1, wherein said node opening is a cylindrical opening.

5. The method of claim 1, wherein said sidewall structures comprise nitride spacers.

6. The method of claim 1, wherein the step of removing said sidewall structures and said portion of said nitride layer is performed by an isotropic wet etch process.

7. The method of claim 1, wherein said second silicon layer comprises a doped polysilicon layer.

8. The method of claim 1, wherein said node-top defining layer comprises a third silicon oxide layer.

9. The method of claim 1, wherein said dielectric film comprises a material selected from the group consisting of stacked oxide-nitride-oxide (ONO) film, NO, $Ta_2O_5$, $TiO_2$, lead zirconate titanate, and barium strontium titanate.

10. The method of claim 1, wherein said conductive layer is selected from the group consisting of a doped silicon and metal layers.

11. The method of claim 1, wherein said step of removing said nitride layer is performed by a wet etch to roughen surfaces of said electrode.

12. The method of claim 11, wherein said wet etch to remove said nitride layer and to roughen said surfaces of said second silicon layer is carried out by a phosphoric acid solution.

13. A method of forming a storage cell on a semiconductor substrate, said method comprising the steps of:

forming a first oxide layer over the substrate;

forming a nitride layer over said first oxide layer;

forming a second oxide layer over said nitride layer;

forming a first silicon layer over said second oxide layer;

defining a node opening in said first silicon layer, said second oxide layer, and said nitride layer upon said first oxide layer;

forming sidewall structures on the sidewalls of said node opening;

defining a contact opening in said first oxide layer under said node opening, said contact opening being defined under a region uncovered by said sidewall structures;

removing said sidewall structures and a portion of said nitride layer nearby said node opening with an isotropic wet etching process to form undercut structures under said second oxide layer;

forming a second silicon layer which fills said contact opening, said undercut structures, said node opening, and on said first silicon layer;

forming and patterning a node-top defining layer on said second silicon layer to leave a node-top defining region;

removing a portion of said second silicon layer and a portion of said first silicon layer uncovered by said node-top defining region;

forming silicon sidewalls on the sidewalls of said node-top defining region, said silicon sidewalls communicating to said first silicon layer and said second silicon layer to form an electrode;

removing said node-top defining region and said second oxide layer;

performing a wet etch to remove said nitride layer and to roughen surfaces of said electrode;

forming a dielectric film conformably on said electrode; and forming a conductive layer over said dielectric layer.

14. The method of claim 13, wherein said first silicon layer comprises a polysilicon layer.

15. The method of claim 13, wherein said sidewall structures comprise nitride spacers.

16. The method of claim 13, wherein said second silicon layer comprises a doped polysilicon layer.

17. The method of claim 13, wherein said silicon sidewalls are formed by forming and etching-back a third silicon layer.

18. he method of claim 13, wherein said dielectric film comprises a material selected from the group consisting of stacked oxide-nitride-oxide (ONO) film, NO, $Ta_2O_5$, $TiO_2$, lead zirconate titanate, and barium strontium titanate.

19. The method of claim 13, wherein said conductive layer is selected from the group consisting of a doped silicon layer and metal layers.

20. The method of claim 13, wherein said wet etch to remove said nitride layer and to roughen the surface of said second silicon layer is carried out by a phosphoric acid solution.

* * * * *